(12) United States Patent
Lee et al.

(10) Patent No.: US 11,079,637 B2
(45) Date of Patent: Aug. 3, 2021

(54) DISPLAY DEVICE

(71) Applicant: LG Display Co., Ltd., Seoul (KR)

(72) Inventors: Hoontaek Lee, Namyangju-si (KR); Jinwon Kim, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/703,586

(22) Filed: Dec. 4, 2019

(65) Prior Publication Data

US 2020/0192141 A1 Jun. 18, 2020

(30) Foreign Application Priority Data

Dec. 13, 2018 (KR) .................. 10-2018-0160934

(51) Int. Cl.
*G02F 1/13* (2006.01)
*G02F 1/1345* (2006.01)
*H05K 1/14* (2006.01)

(52) U.S. Cl.
CPC ......... *G02F 1/13452* (2013.01); *H05K 1/148* (2013.01); *H05K 2201/10128* (2013.01); *H05K 2201/10189* (2013.01)

(58) Field of Classification Search
None
See application file for complete search history.

(56) References Cited

U.S. PATENT DOCUMENTS

| | | | | |
|---|---|---|---|---|
| 3,356,905 A * | 12/1967 | Linn | ............. | H05K 1/148 361/760 |
| 4,058,890 A * | 11/1977 | Pierce | ............. | H05K 7/1417 29/829 |
| 4,307,438 A * | 12/1981 | Grubb | ............. | H05K 1/148 361/784 |
| 7,251,512 B2 | 7/2007 | Komiyama | | |
| 10,136,513 B2 * | 11/2018 | Lee | ............. | H01L 51/5237 |
| 2003/0211873 A1 | 11/2003 | Komiyama | | |
| 2004/0035995 A1 | 2/2004 | Chen et al. | | |
| 2006/0064846 A1 | 3/2006 | Espindola et al. | | |
| 2010/0302494 A1 | 12/2010 | Lee et al. | | |
| 2012/0162949 A1 * | 6/2012 | Han | ............. | F16M 11/38 361/803 |
| 2014/0192270 A1 * | 7/2014 | Park | ............. | H04N 5/645 348/836 |

(Continued)

FOREIGN PATENT DOCUMENTS

CN 1461133 A 12/2003
CN 207040050 U 2/2018

(Continued)

OTHER PUBLICATIONS

European Patent Office, Extended European Search Report and Opinion, EP Patent Application No. 19215413.6, dated Apr. 20, 2020, seven pages.

(Continued)

*Primary Examiner* — Xanthia C Cunningham
(74) *Attorney, Agent, or Firm* — Fenwick & West LLP (57) ABSTRACT

A display device includes: a display panel, a driving printed circuit board connected to the display panel, a control printed circuit board connected to the driving printed circuit board, at least one cable which connects the driving printed circuit board and the control printed circuit board, and a hinge connecting module disposed at both ends of at least one cable. Therefore, it is possible to implement an image having a high resolution by increasing the number of driving printed circuit boards attached to the display panel.

19 Claims, 6 Drawing Sheets

(56) References Cited

U.S. PATENT DOCUMENTS

| | | | |
|---|---|---|---|
| 2014/0354143 A1* | 12/2014 | Jung | H05B 33/02 |
| | | | 313/511 |
| 2014/0375529 A1 | 12/2014 | Yun et al. | |
| 2016/0040462 A1* | 2/2016 | Nakamura | G09F 9/30 |
| | | | 361/679.27 |
| 2016/0109908 A1* | 4/2016 | Siddiqui | H04M 1/0268 |
| | | | 361/679.27 |
| 2016/0209877 A1* | 7/2016 | Chong | H01L 27/1248 |
| 2017/0162987 A1* | 6/2017 | Kasturi | H05K 1/0298 |
| 2018/0163817 A1 | 6/2018 | Timms et al. | |

FOREIGN PATENT DOCUMENTS

| | | |
|---|---|---|
| CN | 108963512 A | 12/2018 |
| EP | 0297699 A2 | 1/1989 |
| EP | 2876746 A1 | 5/2015 |
| JP | 2003-077592 A | 3/2003 |
| KR | 10-2007-0000938 A | 1/2007 |
| KR | 10-2008-0039613 A | 5/2008 |
| KR | 10-2017-0080317 A | 7/2017 |
| WO | WO 2914/132450 A1 | 9/2014 |

OTHER PUBLICATIONS

Japan Patent Office, Notice of Reasons for Refusal, JP Patent Application No. 2019-220819, dated Sep. 29, 2020, six pages.
China National Intellectual Property Administration, Office Action, CN Patent Application No. 201911227363.8, dated May 24, 2021, 12 pages.

* cited by examiner

DISPLAY DEVICE

CROSS-REFERENCE TO RELATED APPLICATIONS

This application claims the priority of the Republic of Korea Patent Application No. 10-2018-0160934 filed on Dec. 13, 2018, in the Korean Intellectual Property Office, the disclosure of which is incorporated herein by reference in its entirety.

BACKGROUND

Field of Technology

The present disclosure relates to a display device, and more particularly, to a display device which implements a high resolution.

Description of the Related Art

Currently, as it enters a full-scale information era, a field of a display device which visually expresses electrical information signals has been rapidly developed and studies are continued to improve performances of various display devices such as a thin thickness, a light weight, and low power consumption. Examples of such a display device include a liquid crystal display device (LCD), a plasma display panel device (PDP), a field emission display device (FED), an electro-wetting display device (EWD), and an organic light emitting display device (OLED).

Various types of display devices include data lines and driving circuit units for driving the data lines to implement images. That is, the driving circuit unit is applied with an image signal from the outside through a cable and converts the image in accordance with a display timing to output the converted image to the data line so that the display device implements images.

Recently, in order to implement realistic images, a large number of data lines and driving circuit units are necessary to implement a high resolution such as 8k resolution (7680× 4320). However, an area where the driving circuit units are disposed is limited in the display device so that there is a limitation to implement a high resolution by increasing the number of driving circuit units.

SUMMARY

An object to be achieved by the present disclosure is to provide a display device which includes more integrated driving printed circuits.

Another object to be achieved by the present disclosure is to provide a display device which implements a high resolution.

Objects of the present disclosure are not limited to the above-mentioned objects, and other objects, which are not mentioned above, can be clearly understood by those skilled in the art from the following descriptions.

According to an aspect of the present disclosure, a display device includes: a display panel, a driving printed circuit board connected to the display panel, a control printed circuit board connected to the driving printed circuit board, at least one cable which connects the driving printed circuit board and the control printed circuit board, and a hinge connecting module disposed at both ends of at least one cable. Therefore, it is possible to implement an image having a high resolution by increasing the number of driving printed circuit boards attached to the display panel.

Other detailed matters of the exemplary embodiments are included in the detailed description and the drawings.

According to the present disclosure, a size of the driving printed circuit board is reduced so that the number of driving printed circuit boards attached to the display panel is increased, thereby implementing a high-quality image.

According to the present disclosure, a plurality of cable pins is disposed on different lines to suppress a contact failure at the time of folding the cable, thereby suppressing a screen failure.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure is defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, the other element may be interposed therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1:
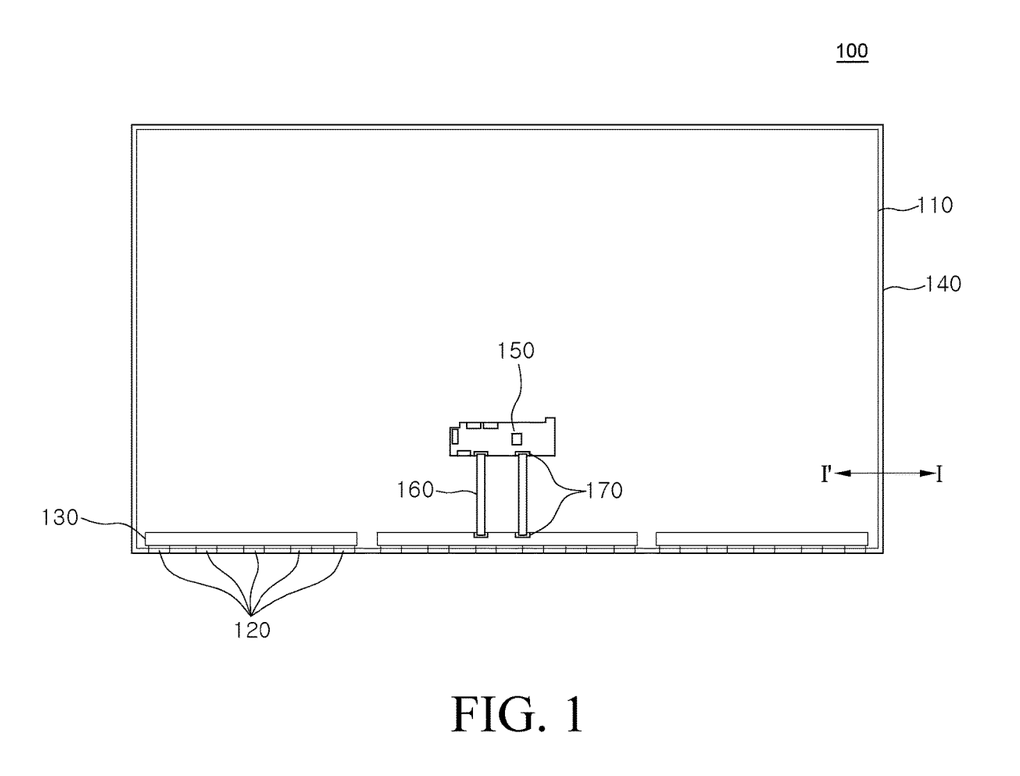
FIG. 1 is a view illustrating a display device according to an embodiment of the present disclosure.

FIG. 1 is a view illustrating a display device according to an embodiment of the present disclosure.

Specifically, FIG. 1 is a rear view of a display device 100 according to an exemplary embodiment of the present disclosure and illustrates a display panel 110, a driving integrated circuit 120, and a driving printed circuit board 130 which are accommodated in a back cover 140.

As illustrated in FIG. 1, the display device 100 according to the exemplary embodiment of the present disclosure includes the display panel 110 which implements images, the driving integrated circuit 120 which drives the display panel 110, the driving printed circuit board 130 which supports the driving integrated circuit 120, and the back cover 140 which accommodates the display panel 110, the driving integrated circuit 120 and the driving printed circuit board 130.

The display device 100 according to the exemplary embodiment of the present disclosure may further include a control printed circuit board 150 disposed on a rear surface of the back cover 140, a cable 160 which connects the driving printed circuit board 130 and the control printed circuit board 150, and a hinge connecting module 170.

As a coupling state of the display device 100 including the above-described components of the display device 100, in a state where the driving integrated circuit 120 and the driving printed circuit board 130 are disposed on the rear surface of the display panel 110, the back cover 140 is coupled to the display panel 110 on the rear surface of the display panel 110 to be integrated. The cable 160 passing through the back cover 140 connects the control printed circuit board 150 and the driving printed circuit board 130 through the hinge connecting module 170.

The display panel 110 is a panel for displaying images. The display panel 110 may be any one of various display panels, such as an organic light emitting display panel, a liquid crystal display panel, a field emission display panel, and an electro-wetting display panel. Hereinafter, as an example, it is described that the display panel 110 of the display device 100 according to an exemplary embodiment of the present disclosure is an organic light emitting display panel.

Figure 2:
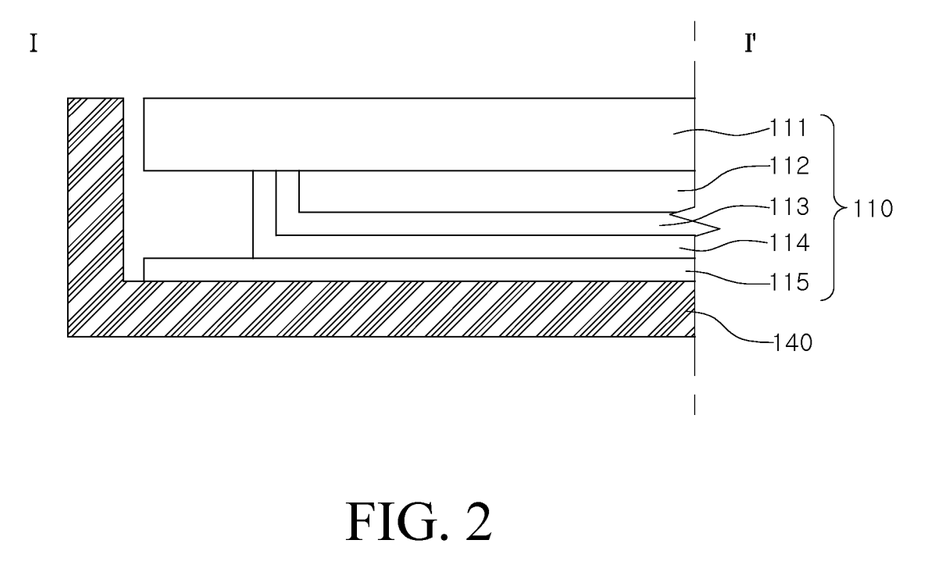
FIG. 2 is a cross-sectional view taken along the line I-I' of FIG. 1, according to an embodiment of the present disclosure.

FIG. 2 is a cross-sectional view taken along the line I-I' of FIG. 1.

Referring to FIG. 2, the display device 100 according to the exemplary embodiment of the present disclosure includes the display panel 110 and the back cover 140 coupled to the display panel 110.

The display panel 110 includes a first substrate 111, an organic light emitting diode 112, a protective layer 113, an adhesive layer 114, and a second substrate 115.

The first substrate 111 may be formed of a transparent and rigid material such as glass or a transparent flexible material. The organic light emitting diode 112 formed for every unit pixel is disposed on the first substrate 111. Even though not illustrated in the drawing, a switching transistor, a driving transistor, and at least one capacitor for driving the organic light emitting diode 112 are disposed between the first substrate 111 and the organic light emitting diode 112.

The organic light emitting diode 112 includes a first electrode which is supplied with currents from a driving transistor (not illustrated) disposed for every unit pixel, a second electrode corresponding to the first electrode, and an organic layer disposed between the first electrode and the second electrode.

The first electrode may be formed of a transparent electrode material and the second electrode may be formed of a metal material. The organic layer may include an organic light emitting layer which emits light, an electron injecting layer and a hole injecting layer which inject electrons and holes into the organic light emitting layer, respectively, an electron transport layer and a hole transport layer which transport the injected electrons and holes to the organic light emitting layer, respectively, and charge generating layers which generate charges such as the electrons and the holes.

Hereinafter, an emission method of the organic light emitting diode 112 will be described. The holes are injected into the organic layer from the first electrode to reach the organic light emitting layer through the hole injecting layer and the hole transport layer. Further, the electrons are injected into the organic layer from the second electrode to reach the organic light emitting layer through the electron injecting layer and the electron transport layer. In the organic light emitting layer, the holes and the electrons are coupled to form excitons and emit light.

The protective layer 113 for protecting the organic light emitting diode 112 is disposed on an upper surface and a side surface of the organic light emitting diode 112. The adhesive layer 114 is disposed on an upper surface and a side surface of the protective layer 113 to bond the first substrate 111 and the second substrate 115. In this case, the adhesive layer 114 may include a moisture adsorbent which absorbs moisture to protect the organic light emitting diode 112 from the moisture.

The second substrate 115 which is opposite to the first substrate 111 is disposed on the adhesive layer 114. The second substrate 115 is an encapsulation plate and for example, may be formed of one of glass, metal foil, and a plastic film. Here, the encapsulation plate may also be referred to as an encapsulation substrate.

However, the display device 100 according to the exemplary embodiment of the present disclosure is described to have a structure in which the organic light emitting diode 112 is encapsulated by the protective layer 113 and the adhesive layer 114, but it is not limited thereto. The display device may have an encapsulation structure in which an adhesive such as sealant is applied on an outer edge of the first substrate 111 and the second substrate 115.

The driving integrated circuit 120 is a configuration for processing a data voltage for displaying images and various driving signals for processing the data voltage, and outputs various control signals to the display panel 110.

Further, the driving integrated circuit 120 may sense a characteristic deviation of the organic light emitting diode 112 and the transistor disposed in the plurality of pixels, for example, luminance deviation between pixels such as a deviation due to the change of a threshold voltage or a mobility of the plurality of transistors or a deviation due to the deterioration of the organic light emitting diode 112 to compensate the data voltage. The driving integrated circuit 120 may transmit the compensated data voltage to the plurality of data lines.

Further, the driving integrated circuit 120 digitalizes a voltage which is an analog format to store the digitalized voltage. To this end, the driving integrated circuit 120 may include an analog digital converter (ADC) and a digital analog converter (DAC). That is, the driving integrated circuit 120 may be defined as a configuration including a compensating circuit.

Even though in FIG. 1, it is illustrated that the driving integrated circuit 120 is implemented by a chip on film (COF) manner, it is not limited thereto and the driving integrated circuit 120 may be disposed by a chip on glass (COG) manner or a tape carrier package (TCP) manner.

The driving printed circuit board 130 is connected to the control printed circuit board 150 through the cable 160 and the hinge connecting module 170 to control the driving integrated circuit 120.

That is, the driving printed circuit board 130 is applied with an image signal from the control printed circuit board 150 to generate a gate control signal, a data control signal, and a power signal for controlling the driving integrated circuit 120 and output the signals to the driving integrated circuit 120.

Further, as illustrated in FIG. 1, the driving printed circuit board 130 may be disposed between the display panel 110 and the back cover 140. More specifically, the driving printed circuit board 130 is disposed on a rear surface of the display panel 110, but is not limited thereto and a position where the driving printed circuit board 130 is disposed may vary.

The back cover 140 accommodates the display panel 110 and is bonded to the rear surface of the second substrate 115 by means of the adhesive layer.

The back cover 140 may be formed of any one of aluminum (Al), copper (Cu), zinc (Zn), silver (Ag), gold (Au), or iron (Fe) having a high thermal conductivity or an alloy of the above-mentioned metals. More specifically, the back cover 140 is desirably formed of aluminum (Al) which has a high thermal conductivity, light weight, and a low cost.

The control printed circuit board 150 receives an image or audio signal input from the outside to transmit the image or audio signal to the display panel 110 or a speaker (not illustrated) to control a display or an audio output.

In other words, the control printed circuit board 150 is connected to the driving printed circuit board 130 by means of the hinge connecting module 170 and the cable 160. The control printed circuit board 150 may output the image signal and the audio signal to the driving printed circuit board 130.

Hereinafter, a coupling relationship of the driving printed circuit board 130, the cable 160, and the hinge connecting module 170 of the display device 100 according to an exemplary embodiment of the present disclosure will be described.

Figure 3:
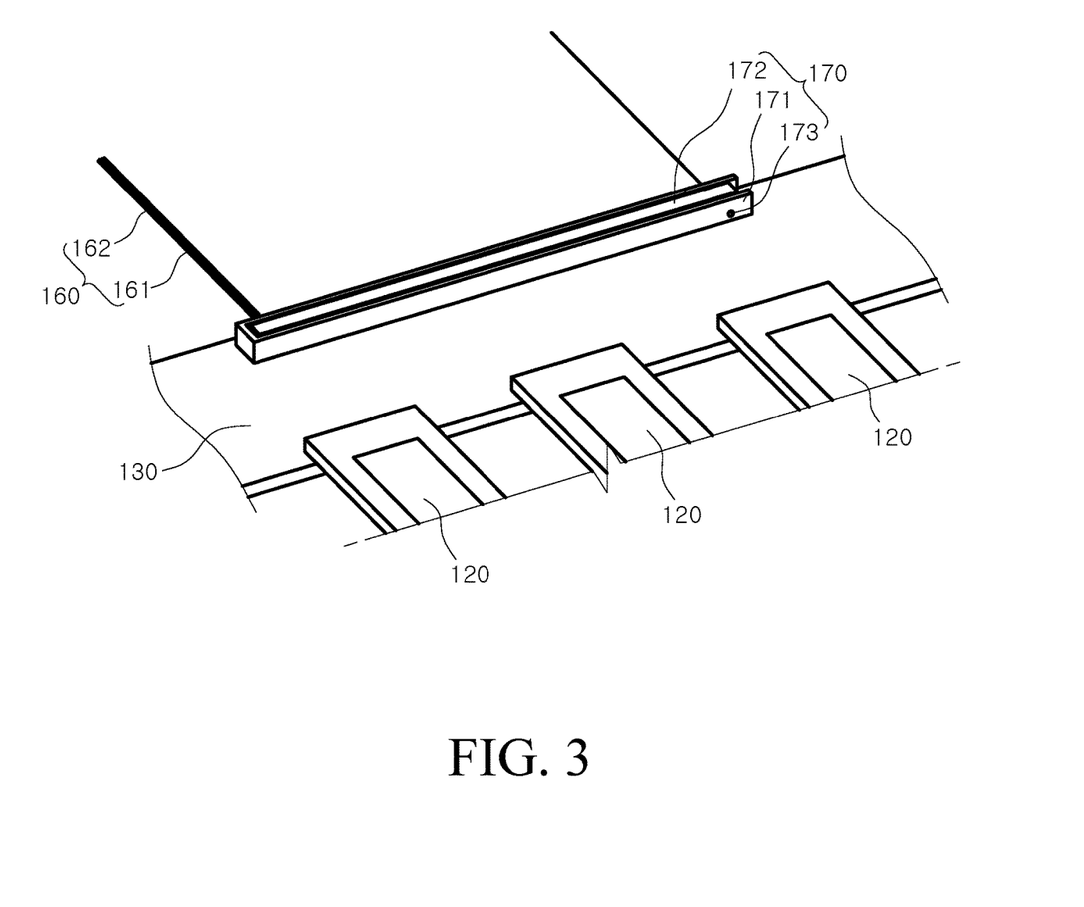
FIG. 3 is a view for explaining a folded state of a hinge connecting module of a display device according to an embodiment of the present disclosure.
Figure 4:
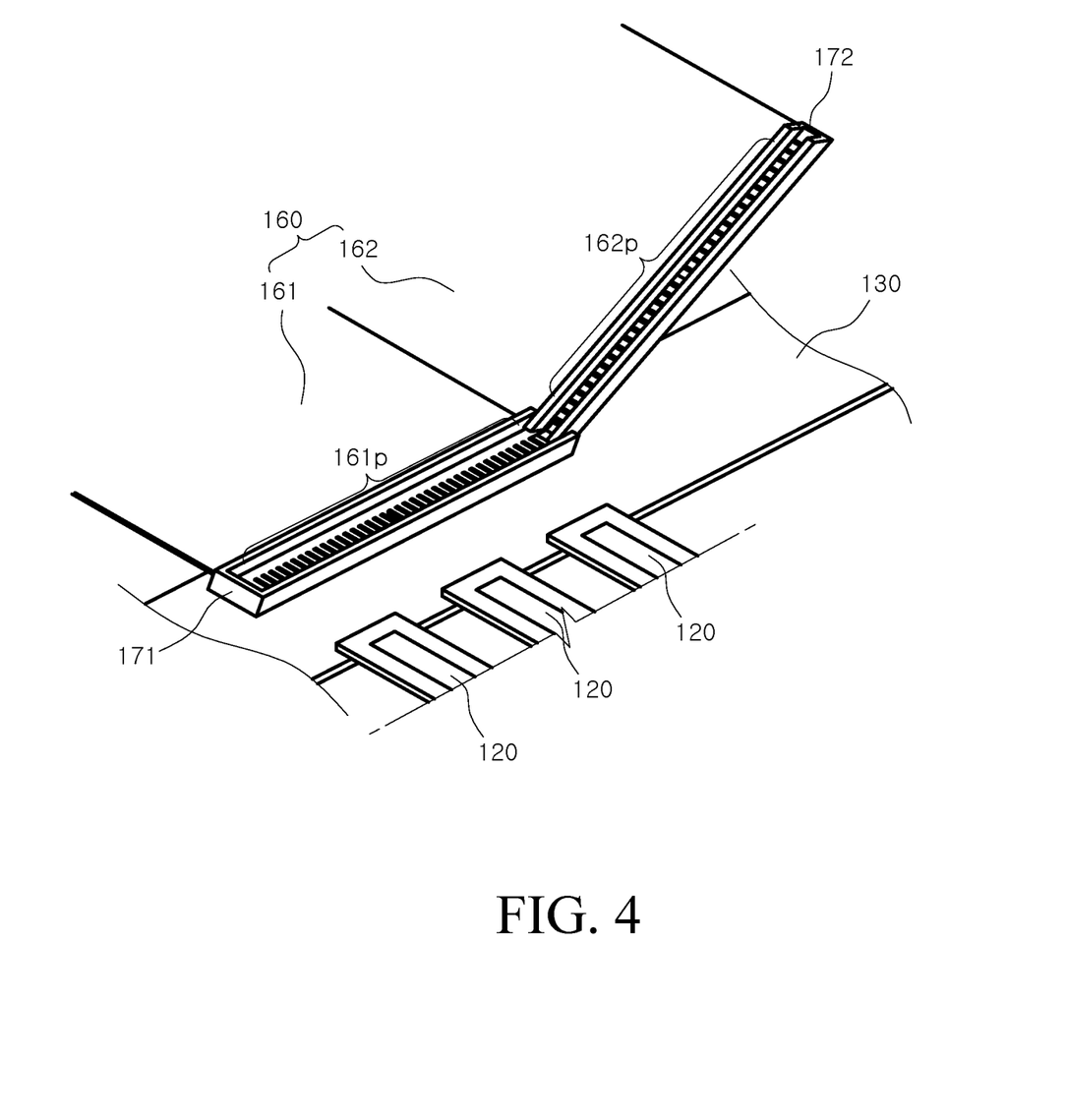
FIG. 4 is a view for explaining an unfolded state of a hinge connecting module of a display device according to an embodiment of the present disclosure.

FIG. 3 is a view for explaining a folded state of a hinge connecting module of a display device according to an exemplary embodiment of the present disclosure. FIG. 4 is a view for explaining an unfolded state of a hinge connecting module of a display device according to an exemplary embodiment of the present disclosure.

For the convenience of description, FIGS. 3 and 4 illustrate only a coupling relationship between the driving printed circuit board 130 and the hinge connecting module 170. The coupling relationship between the control printed circuit board 150 and the hinge connecting module 170 is the same as the coupling relationship between the driving printed circuit board 130 and the hinge connecting module 170 so that the coupling relationship between the driving printed circuit board 130 and the hinge connecting module 170 will be mainly described.

Referring to FIGS. 3 and 4, the hinge connecting module 170 of the display device 100 according to the exemplary embodiment of the present disclosure includes a first hinge unit 171 disposed on the driving printed circuit board 130, a second hinge unit 172 hinge coupled to one side of the first hinge unit 171, and a hinge shaft 173 which hinge couples the first hinge unit 171 and the second hinge unit 172.

Specifically, the first hinge unit 171 is fixed onto the driving printed circuit board 130. The second hinge unit 172 hinge coupled to one side of the first hinge unit 171 by means of the hinge shaft 173 may axially rotate with respect to the hinge shaft 173.

For the purpose of the hinge coupling, an inner accommodating space of the first hinge unit 171 needs to be larger than an outer edge of the second hinge unit 172 to accommodate the second hinge unit 172, according to some embodiments. Specifically in these embodiments, an inner width of the first hinge unit 171 needs to be equal to or larger than a width of the outer edge of the second hinge unit 172 in an extending direction of the hinge shaft 173. Further in some embodiments, an inner length of the first hinge unit 171 needs to be equal to or larger than a length of the outer edge of the second hinge unit 172 in a vertical direction of the extending direction of the hinge shaft 173.

The cable 160 is divided with respect to a portion coupled to the hinge connecting module 170. That is, the cable 160 may be divided into a first cable unit 161 which is coupled to the first hinge unit 171 and a second cable unit 162 which is coupled to the second hinge unit 172.

The first cable unit 161 is coupled to the first hinge unit 171 fixed onto the driving printed circuit board 130 so that the first cable unit 161 may also be fixed onto the driving printed circuit board 130.

The second cable unit 162 is coupled to the second hinge unit 172 which is folded with respect to the hinge shaft 173 so that the second cable unit 162 is also folded with respect to the hinge shaft 173.

Specifically, as illustrated in FIG. 3, when the hinge connecting module 170 of the display device 100 according to the exemplary embodiment of the present disclosure is folded, the second hinge unit 172 is hinged to the first hinge unit 171. Therefore, the second cable unit 162 which is coupled to the second hinge unit 172 is also inwardly folded in an upper surface direction of the first cable unit 161 to overlap each other.

As illustrated in FIG. 4, a plurality of first cable pins 161p is disposed at both ends of the first cable unit 161 and a plurality of second cable pins 162p is disposed at both ends of the second cable unit 162. The first cable pins 161p and the second cable pins 162p may be disposed in the hinge connecting module 170.

Specifically, the plurality of first cable pins 161p may be disposed in the first hinge unit 171 connected to the first cable unit 161. The plurality of second cable pins 162p may be disposed in the second hinge unit 172 connected to the second cable unit 162.

Figure 5:
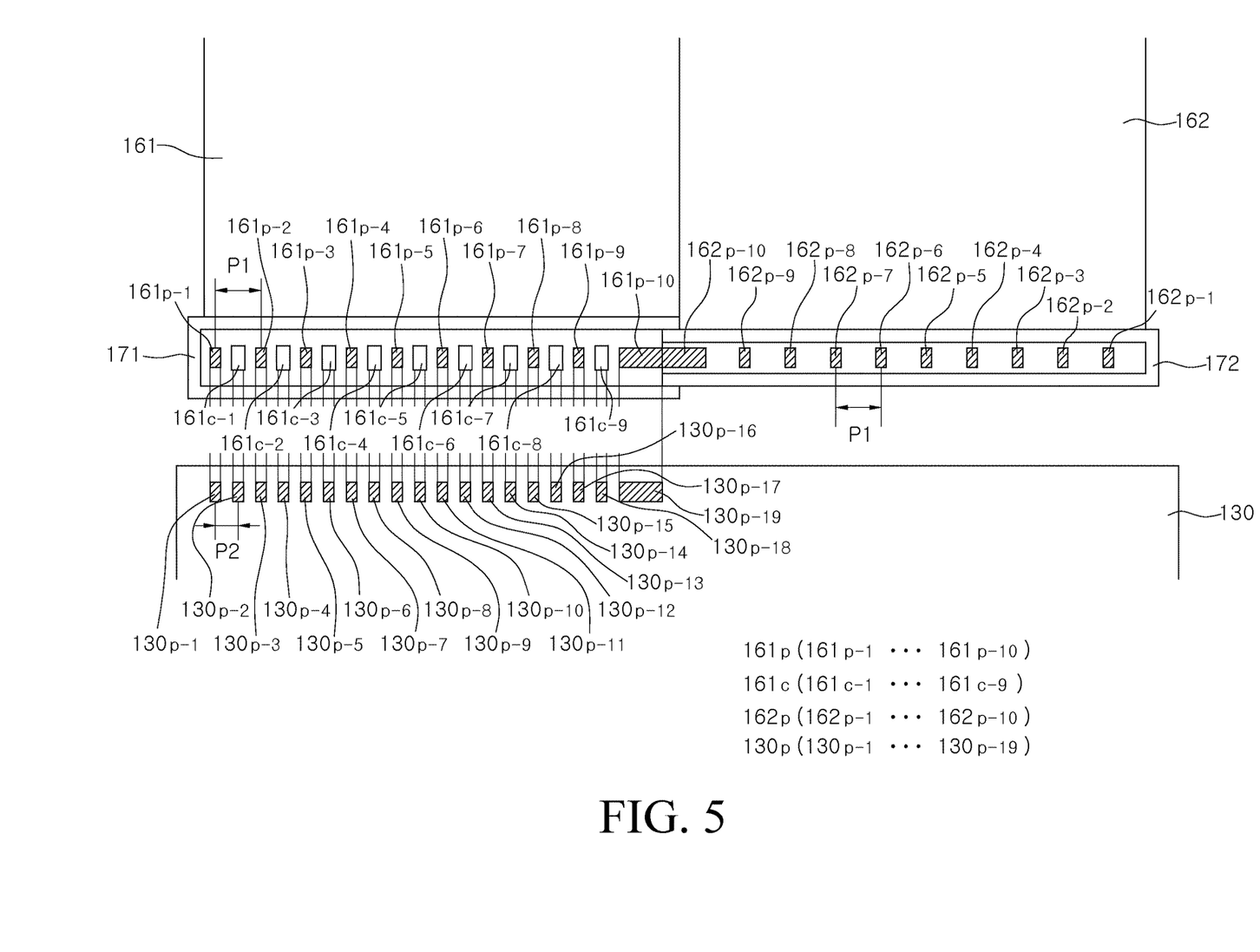
FIG. 5 is a view for explaining a connection relationship of a cable and a driving printed circuit board of a display device according to an embodiment of the present disclosure.

FIG. 5 is a view for explaining a connection relationship of a cable and a driving printed circuit board of a display device according to an exemplary embodiment of the present disclosure.

In order to apply the image signal and the power voltage to the driving printed circuit board 130, the plurality of first cable pins 161p and the plurality of second cable pins 162p may be connected to a plurality of contact pads 130p disposed on the driving printed circuit board 130.

Specifically, as illustrated in FIG. 5, the plurality of first cable pins 161p includes a 1-1-th cable pin 161p-1, a 1-2-th cable pin 161p-2, a 1-3-th cable pin 161p-3, a 1-4-th cable pin 161p-4, a 1-5-th cable pin 161p-5, a 1-6-th cable pin 161p-6, a 1-7-th cable pin 161p-7, a 1-8-th cable pin 161p-8, a 1-9-th cable pin 161p-9, and a 1-10-th cable pin 161p-10 which are sequentially disposed toward the hinge shaft direction.

Further, the plurality of second cable pins 162p includes a 2-1-th cable pin 162p-1, a 2-2-th cable pin 162p-2, a 2-3-th cable pin 162p-3, a 2-4-th cable pin 162p-4, a 2-5-th cable pin 162p-5, a 2-6-th cable pin 162p-6, a 2-7-th cable pin 162p-7, a 2-8-th cable pin 162p-8, a 2-9-th cable pin 162p-9, and a 2-10-th cable pin 162p-10 which are sequentially disposed toward the hinge shaft direction.

On the driving printed circuit board 130, a first contact pad 130p-1 to a nineteenth contact pad 130p-19 which are in direct contact with the plurality of first cable pins 161p and the plurality of second cable pins 162p are included.

Here, the 1-1-th cable pin 161p-1 to 1-9-th cable pin 161p-9 and the 2-1-th cable pin 162p-1 to 2-9-th cable pin 162p-9 may be cable pins which transmit the image signal to the driving printed circuit board 130 and the 1-10-th cable pin 161p-10 and the 2-10-th cable pin 162p-10 may be cable pins which transmit the power voltage.

To this end, sizes of the 1-10-th cable pin 161p-10 and the 2-10-th cable pin 162p-10 may be larger than sizes of the 1-1-th cable pin 161p-1 to 1-9-th cable pin 161p-9 and the 2-1-th cable pin 162p-1 to 2-9-th cable pin 162p-9. Further, the 1-10-th cable pin 161p-10 may be disposed to be adjacent to the hinge shaft 173 among the plurality of first cable pin 161p. Similarly, the 2-10-th cable pin 162p-10 may be disposed to be adjacent to the hinge shaft 173 among the plurality of second cable pin 162p.

By doing this, the 1-10-th cable pin 161p-10 and the 2-10-th cable pin 162p-10 corresponding to power cable pins are disposed to be adjacent to the hinge shaft 173 and have a relatively larger size. Therefore, in the folded state, the 1-10-th cable pin 161p-10 and the 2-10-th cable pin 162p-10 overlap each other without being connected to other cable pins to be stably connected to the nineteenth contact pad 130p-19 so that the power voltage may be stably supplied.

Further, the first cable pin 161p and the second cable pin 162p excluding the 1-10-th cable pin 161p-10 and the 2-10-th cable pin 162p-10 are alternately connected to the plurality of contact pads 130p. Therefore, the driving printed circuit board 130 may be applied with the image signal from the control printed circuit board 150.

Specifically, the 1-1-th cable pin 161p-1 is in contact with the first contact pad 130p-1, the 1-2-th cable pin 161p-2 is in contact with the third contact pad 130p-3, the 1-3-th cable pin 161p-3 is in contact with the fifth contact pad 130p-5, the 1-4-th cable pin 161p-4 is in contact with the seventh contact pad 130p-7, the 1-5-th cable pin 161p-5 is in contact with the ninth contact pad 130p-9, the 1-6-th cable pin 161p-6 is in contact with the eleventh contact pad 130p-11, the 1-7-th cable pin 161p-7 is in contact with the thirteenth contact pad 130p-13, the 1-8-th cable pin 161p-8 is in contact with the fifteenth contact pad 130p-15, and the 1-9-th cable pin 161p-9 is in contact with the seventeenth contact pad 130p-17.

When the second hinge unit 172 is hinged to the first hinge unit 171, the plurality of second cable pins 162p passes through a plurality of connection holes 161c to be connected to the contact pad 130p on the driving printed circuit board 130.

Specifically, the 2-1-th cable pin 162p-1 is connected to a second contact pad 130p-2 through a first connection hole 161c-1, the 2-2-th cable pin 162p-2 is connected to a fourth contact pad 130p-4 through a second connection hole 161c-2, the 2-3-th cable pin 162p-3 is connected to a sixth contact pad 130p-6 through a third connection hole 161c-3, the 2-4-th cable pin 162p-4 is connected to an eighth contact pad 130p-8 through a fourth connection hole 161c-4, the 2-5-th cable pin 162p-5 is connected to a tenth contact pad 130p-10 through a fifth connection hole 161c-5, the 2-6-th cable pin 162p-6 is connected to a twelfth contact pad 130p-12 through a sixth connection hole 161c-6, the 2-7-th cable pin 162p-7 is connected to a fourteenth contact pad 130p-14 through a seventh connection hole 161c-7, the 2-8-th cable pin 162p-8 is connected to a sixteenth contact pad 130p-16 through an eighth connection hole 161c-8, and the 2-9-th cable pin 162p-9 is connected to an eighteenth contact pad 130p-18 through a ninth connection hole 161c-9.

As described above, in a state when the first cable unit 161 and the second cable unit 162 are folded by the hinge connecting module 170, the plurality of first cable pins 161p and the plurality of second cable pins 162p may be connected to the contact pad 130p. Therefore, an interval P1 between the plurality of first cable pins 161p or an interval P1 between the plurality of second cable pins 162p may be larger than an interval between the plurality of contact pads 130p.

Here, the interval P1 between the plurality of first cable pins 161p or the interval P1 between the plurality of second cable pins 162p refers to an interval P1 between centers of the first cable pins 161p or an interval P1 between centers of the plurality of second cable pins 162p. Further, the interval between the plurality of contact pads 130p refers to an interval between centers of the plurality of contact pads 130p.

Specifically, the interval P1 between the plurality of first cable pins 161p or the interval P1 between the plurality of second cable pins 162p may be twice the interval between the plurality of contact pads 130p.

For example, the interval P1 between the plurality of first cable pins 161p or the interval P1 between the plurality of second cable pins 162p may be 0.5 mm and the interval P2 between the contact pads 130p may be 0.25 mm.

That is, the display device 100 according to the exemplary embodiment of the present disclosure includes a hinge connecting module 170 so that the cable 160 is folded to be electrically connected to the plurality of contact pads 130p of the driving printed circuit board 130.

Therefore, the interval of the contact pads 130p of the driving printed circuit board 130 may be reduced by half and thus, an area where the contact pads 130p are disposed in the driving printed circuit board 130 may also be reduced.

Accordingly, the display device 100 according to the exemplary embodiment of the present disclosure may reduce the size of the driving printed circuit board 130 so that the number of driving printed circuit boards 130 attached to the display panel 110 may be increased.

Therefore, as the number of driving printed circuit boards 130 is increased, the resolution to be implemented by the display device 100 according to the exemplary embodiment of the present disclosure may be increased.

Hereinafter, a display device according to another embodiment of the present disclosure will be described with reference to FIG. 6. Since the difference between the display device according to an exemplary embodiment of the present disclosure and the display device according to another exemplary embodiment of the present disclosure is only a configuration of the cable, the configuration of the cable will be mainly described and a redundant description will be omitted.

Figure 6:
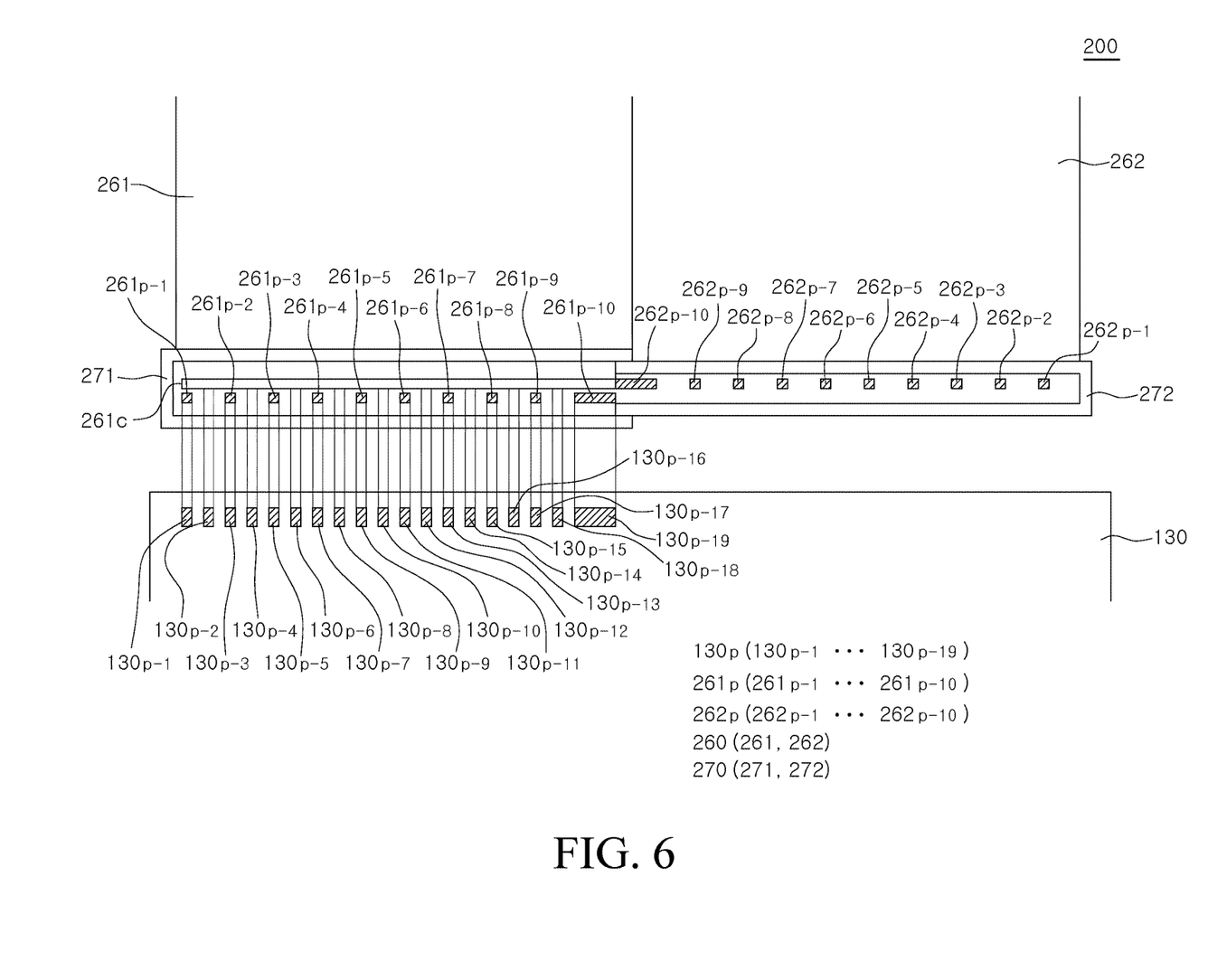
FIG. 6 is a view for explaining a connection relationship of a cable and a driving printed circuit board of a display device according to another embodiment of the present disclosure.

FIG. 6 is a view for explaining a connection relationship of a cable and a driving printed circuit board of a display device according to another exemplary embodiment of the present disclosure.

Referring to FIG. 6, in a display device 200 according to another exemplary embodiment of the present disclosure, a plurality of first cable pins 261p is disposed at both ends of a first cable unit 261. Further, in the first cable pins 261p, a connection hole 261c extending in an arrangement direction of the first cable pins 261p is formed.

In FIG. 6, it is illustrated that the connection hole 261c extends in the arrangement direction of the first cable pins 261p, but it is not limited thereto and the connection hole 261c may be divided into a plurality of connection holes.

Further, a plurality of second cable pins 262p is disposed on an extending line of the connection hole 261c formed in the first cable unit 261 at both ends of the second cable unit 262.

That is, the plurality of first cable pins 261p and the plurality of second cable pins 262p are disposed in the same direction, but on different lines when the second cable unit 262 is unfolded with respect to the first cable unit 261.

Therefore, in the display device 200 according to another exemplary embodiment of the present disclosure, when a hinge connecting module 270 (271, 272) is folded so that the first cable unit 261 and the second cable unit 262 overlap each other, the plurality of second cable pin 262p passes through the connection hole 261c to be connected to the corresponding contact pad 130p of the driving printed circuit board 130.

Specifically, in the display device 200 according to another exemplary embodiment of the present disclosure, when the hinge connecting module 270 is folded, a 1-1-th cable pin 261p-1 is in direct contact with the first contact pad 130p-1, a 2-1-th cable pin 262p-1 passes through the connection hole 261c to be in contact with the second contact pad 130p-2, a 1-2-th cable pin 261p-2 is in direct contact with the third contact pad 130p-3, a 2-2-th cable pin 262p-2 passes through the connection hole 261c to be in contact with the fourth contact pad 130p-4, a 1-3-th cable pin 261p-3 is in direct contact with the fifth contact pad 130p-5, a 2-3-th cable pin 262p-3 passes through the connection hole 261c to be in contact with the sixth contact pad 130p-6, a 1-4-th cable pin 261p-4 is in direct contact with the seventh contact pad 130p-7, a 2-4-th cable pin 262p-4 passes through the connection hole 261c to be in contact with the eighth contact pad 130p-8, a 1-5-th cable pin 261p-5 is in direct contact with the ninth contact pad 130p-9, a 2-5-th cable pin 262p-5 passes through the connection hole 261c to be in contact with the tenth contact pad 130p-10, a 1-6-th cable pin 261p-6 is in direct contact with the eleventh contact pad 130p-11, a 2-6-th cable pin 262p-6 passes through the connection hole 261c to be in contact with the twelfth contact pad 130p-12, a 1-7-th cable pin 261p-7 is in direct contact with the thirteenth contact pad 130p-13, a 2-7-th cable pin 262p-7 passes through the connection hole 261c to be in contact with the fourteenth contact pad 130p-14, a 1-8-th cable pin 261p-8 is in direct contact with the fifteenth contact pad 130p-15, a 2-8-th cable pin 262p-8 passes through the connection hole 261c to be in contact with the sixteenth contact pad 130p-16, a 1-9-th cable pin 261p-9 is in direct contact with the seventeenth contact pad 130p-17, a 2-9-th cable pin 262p-9 passes through the connection hole 261c to be in contact with the eighteenth contact pad 130p-18, a 1-10-th cable pin 261p-10 is in direct contact with the nineteenth contact pad 130p-19, and a 2-10-th cable pin 262p-10 passes through the connection hole 261c to be in contact with the nineteenth contact pad 130p-19.

As described above, in the display device 200 according to another exemplary embodiment of the present disclosure, the plurality of first cable pins 261p and the plurality of second cable pins 262p are disposed on different lines.

Therefore, when the hinge connecting module 270 of the display device 200 according to another exemplary embodiment of the present disclosure is folded so that the first cable unit 261 and the second cable unit 262 overlap each other, the plurality of first cable pins 261p and the plurality of second cable pins 262p are spaced apart from each other. Therefore, confusion in the transmission of the image signal caused by the contact of the first cable pin 261p and the second cable pin 262p may be avoided.

That is, in the display device 200 according to another exemplary embodiment of the present disclosure, the cables 261 and 262 are folded using the hinge connecting module 270 to be in contact with the contact pad 130p. Therefore, as the number of driving printed circuit boards 130 which may be attached to the display panel is increased, the resolution to be implemented by the display device 200 may be increased.

Further, in the display device 200 according to another exemplary embodiment of the present disclosure, the plurality of first cable pins 261p and the plurality of second cable pins 262p are disposed on different lines to suppress the screen failure.

The exemplary embodiments of the present disclosure can also be described as follows:

According to an aspect of the present disclosure, a display device includes: a display panel, a driving printed circuit board connected to the display panel, a control printed circuit board connected to the driving printed circuit board, at least one cable which connects the driving printed circuit board and the control printed circuit board, and a hinge connecting module disposed at both ends of at least one cable. Therefore, it is possible to implement an image having a high resolution by increasing the number of driving printed circuit boards attached to the display panel.

The hinge connecting module may include a first hinge unit which is disposed on the driving printed circuit board and the control printed circuit board and a second hinge unit which axially rotates with respect to a hinge shaft to be hinge coupled to the first hinge unit.

The at least one cable may include a first cable unit coupled to the first hinge unit and a second cable unit coupled to the second hinge unit.

The second cable unit may be folded in a direction of one surface of the first cable unit by the hinge connecting module.

The second cable unit may overlap the first cable unit.

A plurality of first cable pins may be disposed at both ends of the first cable unit and a plurality of second cable pins may be disposed at both ends of the second cable unit.

Each of the driving printed circuit board and the control printed circuit board may include a plurality of contact pads, and the plurality of first cable pins and the second cable pins are connected to the plurality of contact pads.

A plurality of connection holes may be formed between the plurality of first cable pins and the plurality of second cable pins may be inserted into the plurality of connection holes to be electrically connected to the plurality of contact pads.

The plurality of first cable pins and the plurality of second cable pins are disposed on the same line.

At least one connection hole may be formed at one side of the plurality of first cable pins, the plurality of first cable pins and the plurality of second cable pins may be disposed on different lines, the plurality of second cable pins and the at least one connection hole may be disposed on the same line, and the plurality of second cable pins may be inserted into the plurality of connection holes to be electrically connected to the plurality of contact pads.

An interval between the plurality of contact pads may be narrower than an interval between the plurality of first cable pins and an interval between the plurality of second cable pins.

A first cable pin adjacent to the hinge shaft among the plurality of first cable pins and a second cable pin adjacent to the hinge shaft among the plurality of second cable pin correspond to power cable pins.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A hinge connecting module, comprising:
   a first hinge unit coupled to a first cable unit of a cable;
   a second hinge unit coupled to a second cable unit of the cable; and
   a hinge shaft coupling the first hinge unit and the second hinge unit,
   wherein the second hinge unit rotates with respect to the hinge shaft to overlap the first hinge unit,
   wherein one or more connection holes are disposed in the first hinge unit, and
   wherein a plurality of second cable pins of the second cable unit are inserted into the one or more connection holes.

2. The hinge connecting module of claim 1,
   wherein at least one connection hole is at one side of a plurality of first cable pins,
   wherein the plurality of first cable pins and the plurality of second cable pins are disposed on different lines,
   wherein the plurality of second cable pins and the at least one connection hole are disposed on a same line, and
   wherein the plurality of second cable pins is inserted into the connection hole.

3. The hinge connecting module of claim 1, wherein a plurality of connection holes are provided in the first hinge unit, and a number of the connection holes is equal to a number of second cable pins.

4. The hinge connecting module of claim 3, wherein positions of the plurality of connection holes are disposed to correspond to positions of the plurality of second cable pins.

5. The hinge connecting module of claim 3, wherein the plurality of connection holes are arranged on a same line.

6. The hinge connecting module of claim 1, wherein one or more elongated connection holes are provided in the first hinge unit, the elongated connection holes extend along an arrangement direction of first cable pins of the first cable unit.

7. The hinge connecting module of claim 6, wherein the one or more elongated connection holes are disposed between adjacent first cable pins.

8. The hinge connecting module of claim 6, wherein a first cable pin adjacent to the hinge shaft among the plurality of first cable pins and a second cable pin adjacent to the hinge shaft among the plurality of second cable pin correspond to power cable pins.

9. A display device, comprising:
   a display panel;
   two printed circuit boards; and
   a hinge connecting module connected to the two printed circuit boards,
   wherein the hinge connecting module comprises:
      a first hinge unit coupled to a first cable unit of a cable;
      a second hinge unit, coupled to a second cable unit of the cable; and
      a hinge shaft coupling the first hinge unit and the second hinge unit, wherein
         the second hinge unit rotates with respect to the hinge shaft to overlap
         the first hinge unit,
      wherein one or more connection holes are disposed in the first hinge unit, and
      wherein a plurality of second cable pins of the second cable unit are inserted into the one or more connection holes.

10. The display device of claim 9,
    wherein contact pads are disposed on the two printed circuit boards,
    and
    wherein the plurality of second cable pins of the second cable unit are connected to the contact pads.

11. The display device of claim 10,
    wherein a plurality of first cable pins and the plurality of second cable pins are disposed on different lines, and the plurality of second cable pins and the one or more connection holes are disposed on a same line.

12. The display device of claim 10, wherein a number of the one or more connection holes is equal to a number of the plurality of second cable pins.

13. The display device of claim 10, wherein positions of the one or more connection holes are disposed to correspond to positions of the plurality of second cable pins.

14. The display device of claim 13, wherein one or more elongated connection holes are provided in the first hinge unit, the elongated connection holes extend along an arrangement direction of first cable pins of the first cable unit.

15. The display device of claim 14, wherein the one or more elongated connection holes are disposed between adjacent first cable pins.

16. The display device of claim 14, wherein the more elongated connection holes are arranged on a same line.

17. The display device of claim 14, wherein a first cable pin adjacent to the hinge shaft among the plurality of first cable pins and a second cable pin adjacent to the hinge shaft among the plurality of second cable pins correspond to power cable pins.

18. The display device of claim 14, wherein an interval between the plurality of contact pads is narrower than an interval between the plurality of first cable pins and an interval between the plurality of second cable pins.

19. The display device of claim 9, wherein the two printed circuit boards comprise a driving printed circuit board and a control printed circuit board.

* * * * *